United States Patent [19]

Browning et al.

[11] Patent Number: 5,580,829
[45] Date of Patent: Dec. 3, 1996

[54] METHOD FOR MINIMIZING UNWANTED METALLIZATION IN PERIPHERY DIE ON A MULTI-SITE WAFER

[75] Inventors: Clyde H. Browning, Briarcliff; Brian A. Engles, Cedar Park, both of Tex.

[73] Assignee: Motorola, Inc., Schaumburg, Ill.

[21] Appl. No.: 316,440

[22] Filed: Sep. 30, 1994

[51] Int. Cl.$^6$ .......................... H01L 21/301; H01L 21/027
[52] U.S. Cl. .......................... 437/226; 437/228; 437/924; 430/5; 148/DIG. 102
[58] Field of Search ................... 437/8, 924, 180, 437/228 M, 226; 148/33, DIG. 102; 257/797; 430/5, 311, 313

[56] References Cited

U.S. PATENT DOCUMENTS

| | | | |
|---|---|---|---|
| 3,863,331 | 2/1975 | Schade | 437/924 |
| 4,753,901 | 6/1988 | Ellsworth et al. | 437/67 |
| 4,849,313 | 7/1989 | Chapman et al. | 430/5 |
| 5,003,374 | 3/1991 | Vokoun | 257/797 |
| 5,250,983 | 10/1993 | Yamamura | 430/5 |
| 5,407,763 | 4/1995 | Pai | 430/5 |

FOREIGN PATENT DOCUMENTS

| | | | |
|---|---|---|---|
| 59-92527 | 5/1984 | Japan | 437/924 |
| 59-130434 | 7/1984 | Japan | 437/924 |
| 59-188648 | 10/1984 | Japan | 148/DIG. 102 |
| 61-148819 | 7/1986 | Japan | 437/924 |
| 63-196029 | 8/1988 | Japan | 437/924 |
| 2-134633 | 5/1990 | Japan | 430/5 |
| 3-156958 | 7/1991 | Japan . | |
| 4-279427 | 9/1992 | Japan | 437/924 |

OTHER PUBLICATIONS

S. Wolf & R. N. Tauber, "Silicon Processing for the VLSI Era" vol. I, 1986 p. 472–483.

Primary Examiner—Tom Thomas
Assistant Examiner—Leon Radomsky
Attorney, Agent, or Firm—Minh-Hien N. Clark

[57] ABSTRACT

A method and apparatus for providing a mask (200) on a multi-site wafer (100) is accomplished by first creating a first mask key (204) which contains information, such as alignment cues and test structures. A copy of the first mask key is modified to produce a second mask key (201). When the two mask keys are transferred to adjacent sites on the wafer, they physically overlap, preventing double-exposure of the information in the first mask key.

4 Claims, 3 Drawing Sheets

1

METHOD FOR MINIMIZING UNWANTED METALLIZATION IN PERIPHERY DIE ON A MULTI-SITE WAFER

TECHNICAL FIELD OF THE INVENTION

This invention relates generally to multi-layer multi-site wafer processing, and more specifically to scribe field generation on such wafers.

BACKGROUND OF THE INVENTION

As is known, integrated circuits are fabricated on wafers via multi-layer fabrication processes. This involves a series of processing steps such as cleaning, impurity doping, material deposition, and selective etching. A number of these steps require patterns, or masks, on the wafer, such that only certain areas of the wafer are affected. The desired patterns are produced on the wafer by a photolithography process which involves applying a photosensitive resistive material on the wafer, exposing with the desired pattern, and developing the wafer to remove the photosensitive resistive material.

During the photolithography process, alignment symbols are used to ensure that subsequent layers are correctly positioned over preceding layers. These alignment symbols, along with some test structures that permit general parametric testing, are normally placed in an overlap area between two adjacent sites. This overlap area is known as the scribe field and is created by overlapping a portion of the mask area with a previously exposed adjacent site each time the mask image is transferred to the wafer. Portions of the overlap area must not be doubly exposed when this occurs, or the alignment cues and test structures from the first exposure will be lost.

To prevent the loss of this information, one prior art solution is to create a single non-exposure window in the scribe area where the second exposure would normally occur. While this prevents the loss of information, it has certain drawbacks. For example, the die that are on the perimeter of the wafer have sections of their scribe in which no overlap occurs because there is not a neighboring exposure site. Thus, in a metal deposition process step, the area encompassed by the large non-exposure window, is covered with relatively large metal strips. After the wafer is cut into a plurality of die, or dice, the metal and the wafer substrate material have different coefficients of thermal expansion, which, when a die is heated, causes the metal strips to pull away from the substrate and bow upward. This bowing, when the die is attached to the package lead frame, can short contact structures of a package lead frame.

Another prior art solution to prevent the loss of the alignment symbols and test structures is to create many non-exposure windows as shown in FIG. 6. FIG. 6 illustrates a first scribe field, containing both alignment symbols and test structures, a second scribe field containing two non-exposure windows, and an overlap area. While this technique is an improvement over the single non-exposure window solution for perimeter dice, these windows can be large, thus exhibiting the same metal bowing problem described above.

In addition to the above mentioned difficulties, the non-exposure windows are manually generated based on the first scribe field. Thus, human error may cause the second scribe field to be incorrect, not generated, or not updated when the first scribe field changes. If any of these errors occur, the first scribe field information will be lost.

Therefore, a need exists for a method and apparatus that automatically generates a second scribe field and minimizes additional metallic material such that the metal bowing problem is eliminated.

DETAILED DESCRIPTION OF THE DRAWINGS

Generally, the present invention provides a method and apparatus for providing a mask key on a multi-site wafer. This is accomplished by creating a first mask key that contains masking information, such as alignment cues and test structures. Next, a copy of the first mask key is modified to produce a second mask key. When the two mask keys are transferred to adjacent sites on the wafer, they physically overlap such that the information of the first mask key is preserved. Such a method and apparatus reduces the amount of extra metallic material deposited on dice such that bowing is eliminated, and human error is virtually eliminated by creating the second mask key automatically.

Figure 1:
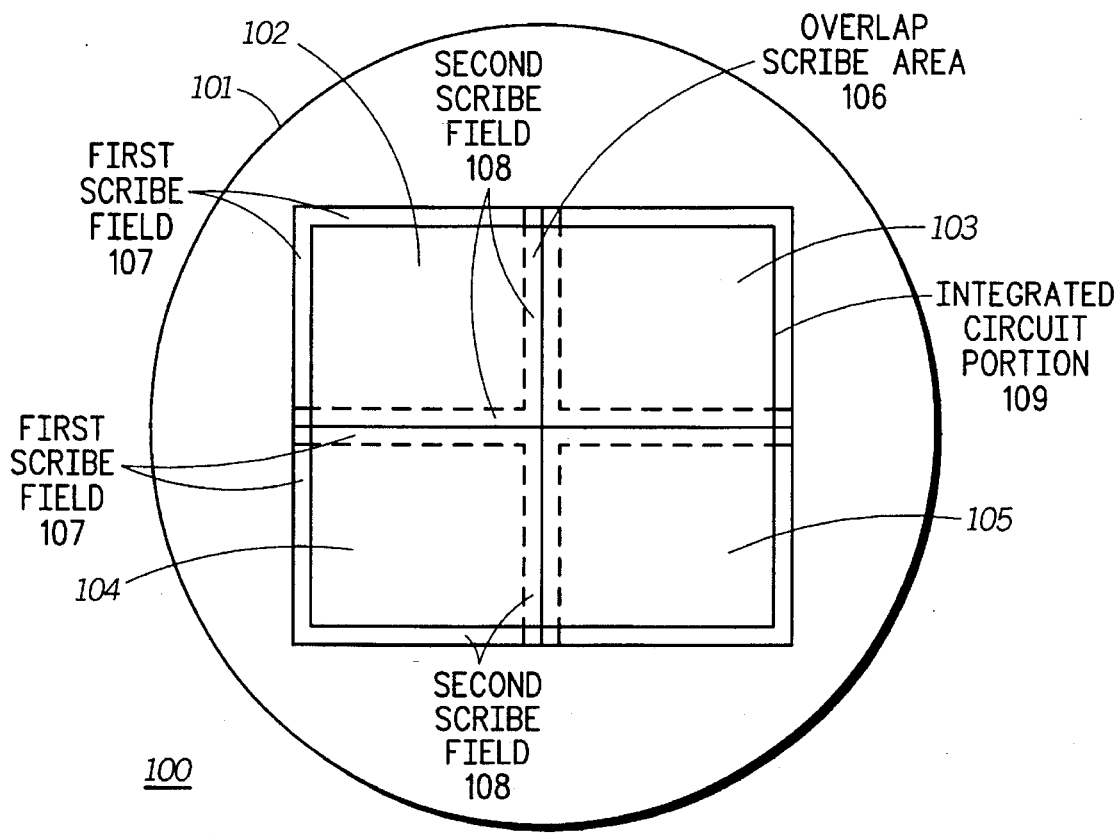
FIG. 1 illustrates a multi-site wafer containing a plurality of dice with both overlap and non-overlap scribe areas in accordance with the present invention.

FIG. 1 illustrates a multi-site wafer 100 that includes a wafer 101, a plurality of sites, or dice, 102–105, an overlap scribe area 106, a first scribe field 107, a second scribe field 108, and an integrated circuit 109. In many cases, the wafer 101 is comprised of a slice of pure single-crystal silicon, although other materials can be used for the wafer.

The integrated circuit 109 is created through a sequence of pattern definition steps interspersed with other process steps such as etching, oxidation, doping, and material deposition. Pattern definition, or masking, is achieved by coating the wafer with a layer of photosensitive emulsion, or photoresist. The photoresist is then optically exposed, on a site by site basis, with the desired pattern and developed to remove the photoresist from the areas selected by the pattern. With the photoresist removed from the selected areas, an area specific process such as etching, doping, or material deposition can take place in the selected areas.

Figure 2:
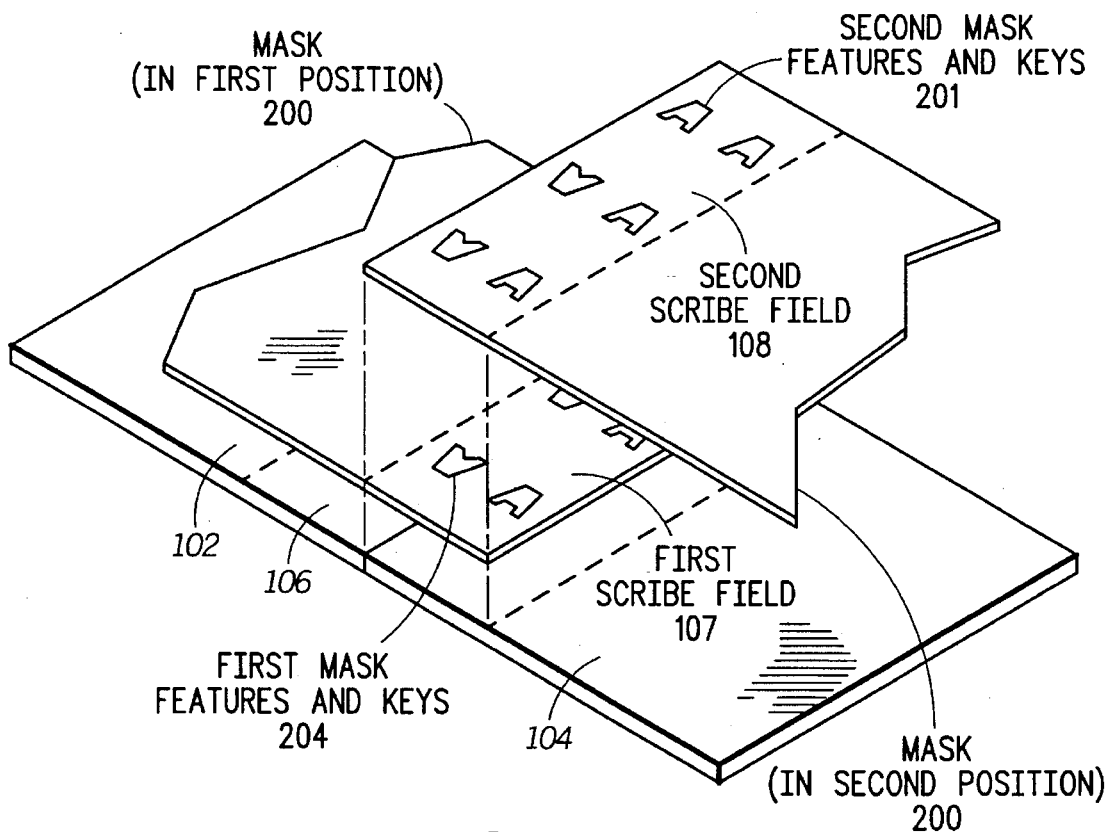
FIG. 2 illustrates a geometric view of mask placement over a wafer during photolithography in accordance with the present invention.

To achieve correct structures within the integrated circuit 109, the current layer must be correctly positioned over preceding layers. This is accomplished by providing alignment keys in the overlap scribe area 106. Such keys are designed to allow photolithography equipment to correctly align the current mask over previously exposed masks. The shapes of the keys are generally dictated by the type of equipment used and is not germane to this discussion. FIG. 2 illustrates a geometric view of mask placement. As shown, a mask 200 includes first mask features and keys 204 within the first scribe field 107 and second mask features and keys 201 in the second scribe field 108. When the mask 200 is in a first position and the optical pattern is transferred, the first site 102 and the overlap scribe area 106 are exposed.

After exposing the first site 102, the mask 200 is stepped to the right, placing it in the second position. Once in the second position, the optical pattern is transferred and the second site 103 is exposed. When the second site 103 is exposed, the overlap scribe area 106 is exposed with the information that is contained in the second scribe field 108, such that the information exposed while in the first position is preserved.

The number of overlap areas that surround a site depends on the location of the particular site on the wafer 101. If the site is towards the center of the wafer and is surrounded by adjacent sites, it will have overlap areas 106 on all sides. If, however, it is on the edge or perimeter of the wafer, it will not have an overlap area 106 on the side or sides that border the edge, but it will have an overlap area 106 on all sides that have an adjacent site.

Referring to FIG. 1, it can be seen that all of the sites on the multi-site wafer 100 are perimeter sites and have non-overlap scribe areas on the sides that border the perimeter of the wafer. A perimeter section exists in dice 103–105 that contains only information from the second scribe field 108, which will only contain the patterns comprising second mask features and keys 201. In comparison, the overlap scribe area 106 contains the patterns from both the first mask features and keys 204 and the second mask features and keys 201.

Figure 3:
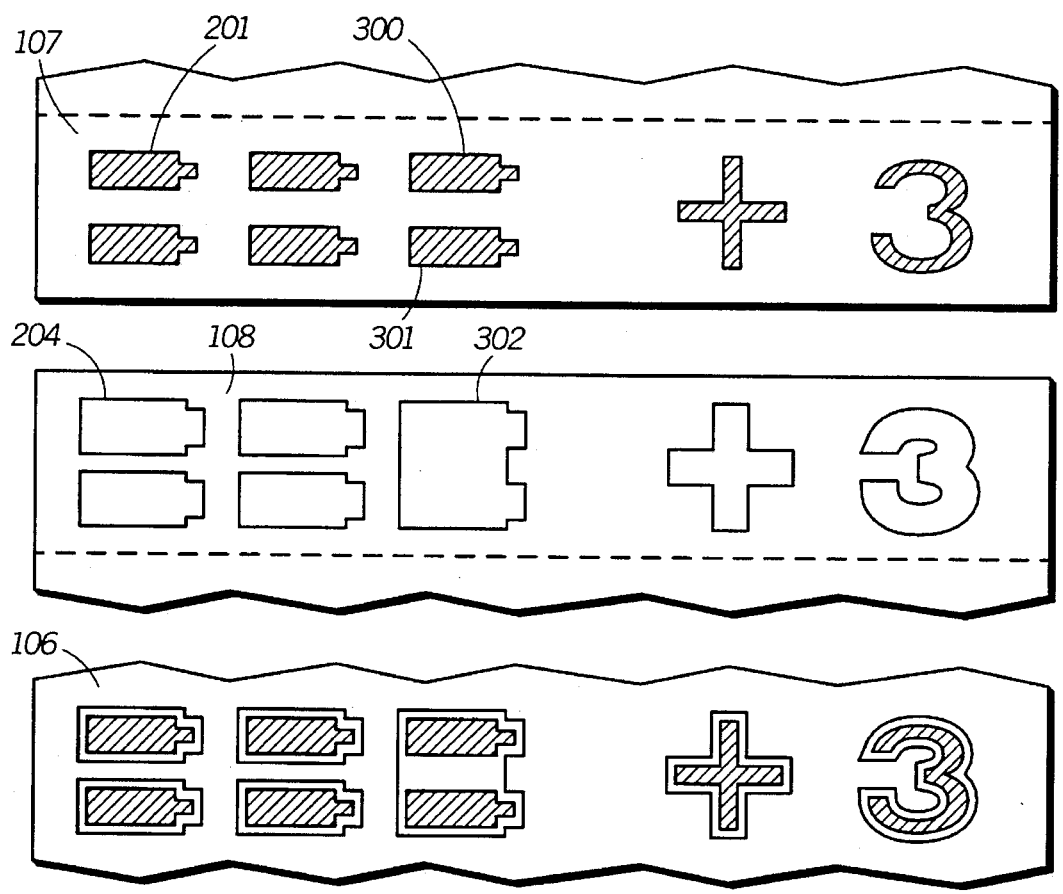
FIG. 3 illustrates two scribe fields that contain mask keys and features and their resulting patterns in an overlap scribe area in accordance with the present invention.

FIG. 3 illustrates the scribe fields 107 and 108 of the mask 200 and their associated mask features and keys 204 and 201. The mask features and keys 201 and 204 include alignment symbols and test structures 300–302. The alignment symbols and test structures 300–302 are assumed to be opaque and prevent the exposure of the photoresist over which they are positioned.

In the case where scribe field 107 is the only scribe field exposed in the scribe area of a particular die, a pattern matching the scribe features will be transferred to the photoresist. When the photoresist is developed, the photoresist will be removed from the entire scribe area, except in the locations where the features were located. In the case where both scribe fields 107 and 108 are both exposed in the scribe area of a particular die, the same result would be achieved. Overlap scribe area 106 illustrates the two scribe fields superimposed, i.e., the opaque areas of scribe field 108 cover the opaque areas of field 107, ensuring that none of the information in scribe field 107 is exposed and lost.

Scribe field 108 is derived from the information in scribe field 107. The features and patterns in scribe field 107 are first oversized by a first predetermined amount, and then undersized by a second predetermined amount. The objective of oversizing and then undersizing is to achieve a pattern in the scribe field 108 that will not expose any of the area in the overlap scribe area 106 that the scribe field 107 did not expose. While oversizing alone will accomplish this objective, there is a potential of creating features in the scribe that are too small for the tolerances of the photolithography equipment.

For example, assume that alignment symbols 300 and 301 are 9 microns apart, the desired amount of oversizing on the scribe features is 4 microns on every edge, and the smallest geometry that the photolithography equipment can tolerate is 2 microns. If alignment symbols 300 and 301 are oversized by 4 microns each, the distance between the resultant oversized symbols will be 1 micron, which is beyond the tolerance of the photolithography equipment.

By first oversizing and then undersizing, this problem can be eliminated. Assume the same initial criteria as above. If the alignment symbols 300 and 301 are first oversized by 5 microns, the resulting oversized masks will partially overlap, and the features will "join" into a single feature. If the oversizing step is then followed by an undersizing step where the features are undersized by 1 micron, the joined feature will remain joined, resulting in the joined feature 302. After oversizing by 5 microns and undersizing by 1 micron, the cumulative oversizing will result in 4 microns. By undersizing the oversized features by 1 micron each and maintaining any features that joined during the oversizing, the minimum distance between any two features is 2 microns, which is within the tolerance limitations of the photolithography equipment.

In the perimeter dice 103–105, a perimeter section exists wherein the second scribe field 108 is the only scribe field exposed. In this case, the opaque areas in scribe field 108, which are slightly modified versions of the opaque areas of scribe field 107, leave behind a minimal amount of photoresist. Thus, a minimal amount of metal is deposited substantially eliminating the metal bowing problems of typical prior art solutions.

Figure 4:
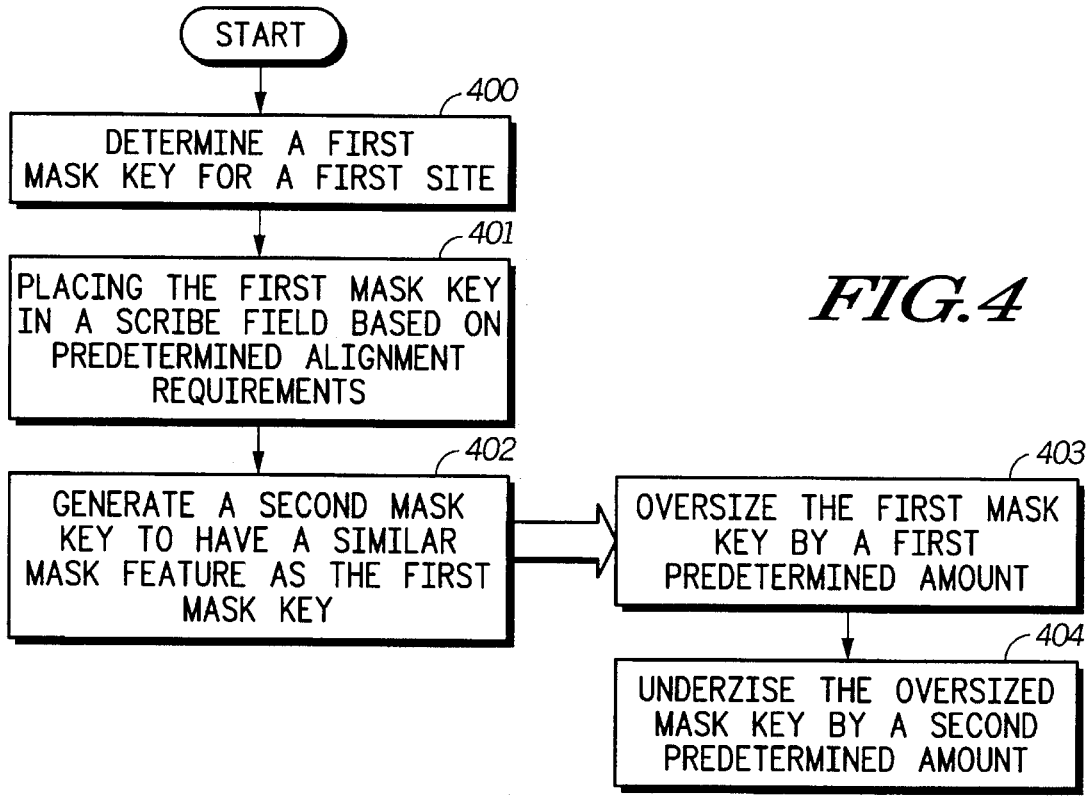
FIG. 4 illustrates, in a logic diagram, a method for generating a second mask key in accordance with the present invention.

FIG. 4 illustrates a logic diagram that may be used to implement an embodiment of the present invention. At step 400, a first mask key is determined according to the needs of the process. Alignment keys are assembled in the first mask key according to the predetermined requirements of the optical exposure equipment, and test structures are provided in the first mask key to aid in process characterization and other tasks.

At step 401, the first mask key is placed within a scribe field according to predetermined alignment requirements of the optical exposure equipment. The optical exposure equipment uses the mask key in the scribe field for orientation purposes and requires them to be located in certain areas of the mask by means of the alignment requirements.

A second mask key which has substantially identical features to the first mask key is generated in step 402. The second mask key must prevent the double-exposure of the alignment keys and test structures in the first mask key. This is achieved by duplicating the features in the first mask key, and oversizing them by a specific amount which is shown at step 403. The amount of oversizing depends on the accuracy of the photolithography equipment. A typical amount of oversizing might be 10%, but as the accuracy of the photolithography equipment increases, the amount of oversizing is reduced to the point where the second mask key is substantially identical to the first mask key.

In step 404 the oversized first mask key is undersized by a second predetermined amount to obtain the second mask key. The undersizing in this step accounts for the extra oversizing that took place in step 402 and ensures that there are no mask features that are smaller than the capabilities of the process. The predetermined amount of the undersizing is coupled to the smallest mask feature that the process is able to support.

In the case where the first mask key and the second mask key are developed individually, human error can result. If the first mask key and second mask key are developed concurrently and the first mask key is later altered without updating the second mask key, information in the first mask key is likely to be lost. Due to the fact that all of the steps 400–404 are performed using an algorithm, human error can be virtually eliminated. In this case the second mask key that is generated via the algorithm is completely dependent on the information that is present in the first mask key, and any changes that are made to the first mask key will be reflected in the second mask key.

Figure 5:
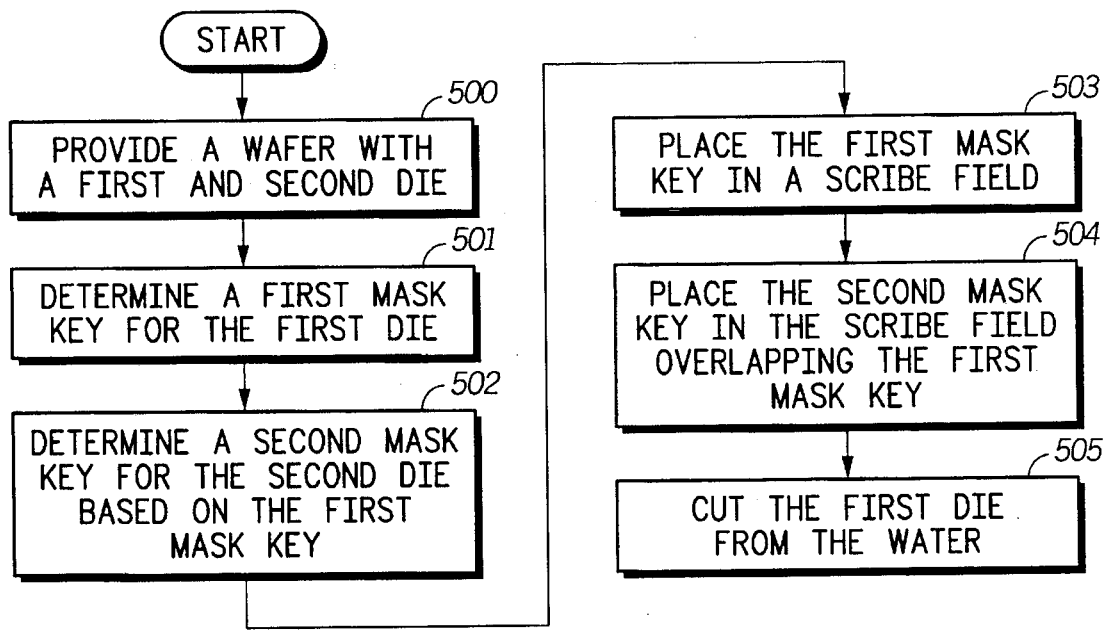
FIG. 5 illustrates, in a logic diagram, a method for fabricating a die in accordance with the present invention.
Figure 6:
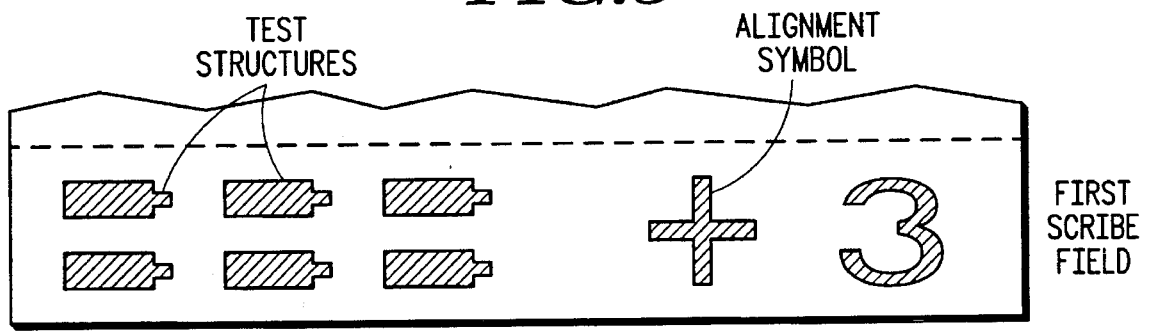
FIG. 6 illustrates a prior art technique for generating a second mask key.
Figure 6:
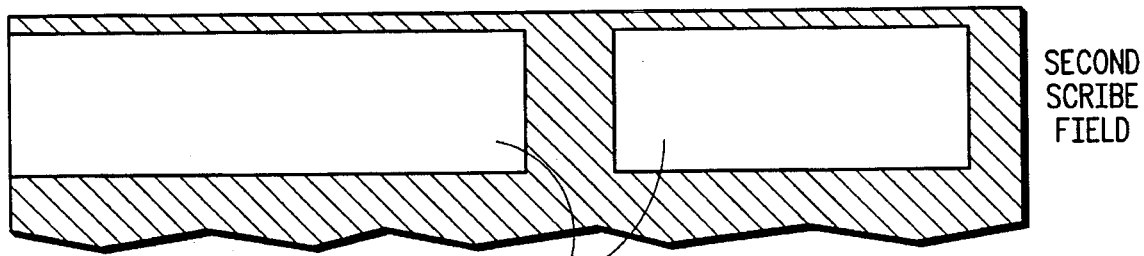
Figure 6:
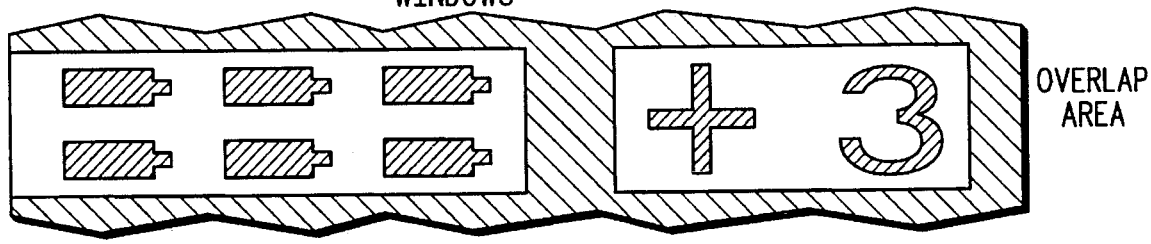

FIG. 5 illustrates a logic diagram that may be used to produce a die in accordance with the present invention. At step 500, a wafer is provided that has at least two sites or dies. At step 501 a first mask key is determined. This determination step is detailed in corresponding step 400 of FIG. 4. In step 502, a second mask key is determined based on the first mask key which is detailed in corresponding step 402 of FIG. 4.

In step 503, the first mask key is transferred to the scribe field as the first die site undergoes the photolithography process. Step 504 comprises placing the mask such that the second mask key in the scribe field overlaps the first mask key as the second die site is processed by the photolithography processing equipment. In the final step 505, the wafer is cut to yield at least the first die.

The present invention provides a method and apparatus for providing a mask key on a multi-site wafer. By utilizing the method and apparatus described herein, unwanted metal lines in the scribe areas of perimeter die can be avoided. Typical prior art techniques suffer from reduced die yields due to excess metal being deposited in the scribe areas of perimeter die which results in lead frames being shorted during assembly. In addition to this problem, typical techniques suffer from human error in that the second scribe field may not be correctly generated. If incorrectly generated, the first scribe field information can be lost or corrupted. By employing the automatic process of the present invention, human error can be avoided.

We claim:

1. A method for utilizing a mask on a multi-site wafer in order to minimize unwanted metallization, wherein adjacent sites of the multi-site wafer have an overlap portion, the method comprising the steps of:

positioning, for a first exposure, a first mask key of the mask within the overlap portion of a first site, wherein the first mask key includes at least alignment symbols;

positioning, for a second exposure, a second mask key of the mask within the overlap portion of the first site, wherein the second mask key substantially superimposes the first mask key, wherein the second mask key is based on the first mask key, and wherein alignment symbols of the second mask key are produced by:

oversizing the alignment symbols of the first mask key by a first amount to produce oversized mask symbols, and undersizing the oversized mask symbols by a second amount.

2. The method of claim 1, wherein the first amount and the second amount are based on photolithographic capabilities, and wherein the first amount is at least as great as the second amount.

3. A method for fabricating a die, the method comprising the steps of:

providing a wafer with a first die having a first scribe field overlapping a second scribe field of a second die, wherein the first die and the second die are physically adjacent;

determining a first mask key for the first scribe field;

generating a second mask key for the second scribe field based on the first mask key, wherein mask features of the second mask key are generated by oversizing mask futures of the first mask key by a first amount to produce oversized mask symbols, and undersizing the oversized mask symbols by a second amount;

sequentially exposing the first mask key and the second mask key, wherein the second mask key preserves the mask features of the first mask key;

depositing metal to the wafer, wherein metallization in peripheral areas of the wafer is minimized based on the second mask key; and cutting the wafer to produce the first die.

4. A method for minimizing metallization for a perimeter die on a multi-site wafer, the method comprising the steps of:

exposing a mask at a first site of the multi-site wafer corresponding to the perimeter die, wherein the mask includes a first mask key and a second mask key, wherein the second mask key is generated by oversizing features of the first mask key by a first amount to produce oversized mask features and undersizing the oversized mask features by a second amount;

exposing the mask at a second site of the multi-site wafer, wherein the second site is adjacent to the first site, wherein the second mask key of the second site overlaps the first mask key of the first site in an overlap area to preserve information of the first mask key;

etching the first site of the multi-site wafer to develop a pattern, wherein the pattern is based on the second mask key at a peripheral region of the perimeter die, and wherein the pattern is based on the first mask key in the overlap area; and depositing metal to the multi-site wafer based on the pattern, wherein metallization in the peripheral region of the first site is minimized based on the second mask key.

\* \* \* \* \*